United States Patent
Yoshikawa et al.

(10) Patent No.: US 7,309,456 B2
(45) Date of Patent: Dec. 18, 2007

(54) ELECTRICALLY CONDUCTIVE POLYMER, SEMICONDUCTIVE COMPOSITION USING THE SAME AND SEMICONDUCTIVE MEMBER FOR ELECTROPHOTOGRAPHIC EQUIPMENT

(75) Inventors: Hitoshi Yoshikawa, Komaki (JP); Minobu Iinuma, Ichinomiya (JP); Hiroki Sugiura, Komaki (JP)

(73) Assignee: Tokai Rubber Industries, Ltd., Komaki-shi (JP)

( * ) Notice: Subject to any disclaimer, the term of this patent is extended or adjusted under 35 U.S.C. 154(b) by 435 days.

(21) Appl. No.: 10/927,116

(22) Filed: Aug. 27, 2004

(65) Prior Publication Data
US 2005/0045856 A1    Mar. 3, 2005

(30) Foreign Application Priority Data

| Aug. 28, 2003 | (JP) | ............................. | 2003-305171 |
| Mar. 31, 2004 | (JP) | ............................. | 2004-105266 |
| Aug. 26, 2004 | (JP) | ............................. | 2004-246802 |

(51) Int. Cl.
  *H01B 1/12*    (2006.01)
  *H01B 1/20*    (2006.01)

(52) U.S. Cl. ...................................... 252/500; 528/377

(58) Field of Classification Search ................ 252/500; 562/91; 528/171, 377, 380, 424
See application file for complete search history.

(56) References Cited

U.S. PATENT DOCUMENTS

| 5,384,215 A | * | 1/1995 | Sato et al. ................... 429/213 |
| 5,436,796 A | * | 7/1995 | Abe et al. .................... 361/525 |
| 5,716,550 A | * | 2/1998 | Gardner et al. ............. 252/500 |

FOREIGN PATENT DOCUMENTS

| JP | 9-48921 | 2/1997 |
| JP | 2001-324882 | 11/2001 |
| JP | 2002-348350 | 12/2002 |
| JP | 2004-184512 | 7/2004 |

\* cited by examiner

*Primary Examiner*—Mark Kopec
(74) *Attorney, Agent, or Firm*—Kratz, Quintos & Hanson, LLP

(57) ABSTRACT

An electrically conductive polymer available at low-cost and superior both in electrical conductivity and solubility. The electrically conductive polymer is solvent soluble and is obtained by imparting electrical conductivity to a pi-electron conjugated polymer by means of a dopant; the dopant comprises an alkylbenzenesulfonic acid or its salt having 2 or more alkyl substituent groups, wherein a total carbon number of the alkyl substituent groups is 10 to 37.

7 Claims, No Drawings

ELECTRICALLY CONDUCTIVE POLYMER, SEMICONDUCTIVE COMPOSITION USING THE SAME AND SEMICONDUCTIVE MEMBER FOR ELECTROPHOTOGRAPHIC EQUIPMENT

BACKGROUND OF THE INVENTION

1. Field of the Invention

The present invention relates to an electrically conductive polymer, a semiconductive composition using the electrically conductive polymer and a semiconductive member or electrophotographic equipment, especially to be used for constituting members of electrophotographic equipment such as a charging roll.

2. Description of the Art

Generally, it is possible to make a pi-electron conjugated polymer such as polyaniline into an electrically conductive polymer by doping by means of a dopant. However, solubility of the electrically conductive polymer to solvent is deteriorated due to a dopant.

Thus, when the pi-electron conjugated polymer is made into an out-of-doping state without use of a dopant, the polymer is given solubility and be soluble into a solvent so as to be available for use as a coating. For example, when elaborating polyaniline in an out-of-doping state, the thus obtained polyaniline is soluble into N-methyl-2-pyrrolidone (NMP), very high boiling-point solvent, so as to be used as a coating (see Japanese Unexamined Patent Publication No. 2001-324882).

However, since a doping by means of a halogen gas or the like is indispensable as a post-treatment to impart electrical conductivity to the polymer in the above-mentioned method, uniform control is difficult and process becomes complicated. Alternatively, it is possible to impart solubility to the polymer by introducing long-chain alkyl substituent groups into a monomer main chain such as aniline instead of making into an out-of-doping state. However, the monomer as a row material is expensive to render a restriction for industrial use. As described above, it is a current situation that an electrically conductive polymer available at low-cost and superior both in electrical conductivity and solubility is still not available. Under such circumstances, such an electrically conductive polymer has been strongly demanded.

In view of the foregoing, it is an object of the present invention to provide an electrically conductive polymer available at low-cost and superior both in electrical conductivity and solubility, a semiconductive composition using the electrically conductive polymer and a semiconductive member for electrophotographic equipment.

SUMMARY OF THE INVENTION

In accordance with a first aspect of the present invention to achieve the aforesaid object, there is provided a solvent-soluble electrically conductive polymer obtained by imparting electrical conductivity to a pi-electron conjugated polymer by means of a dopant; the dopant comprises an alkylbenzenesulfonic acid or its salt having 2 or more alkyl substituent groups, wherein a total carbon number of the alkyl substituent groups is 10 to 37.

In accordance with a second aspect of the present invention to achieve the aforesaid object, there is provided a semiconductive composition comprising the aforesaid electrically conductive polymer and a non-conjugated polymer.

In accordance with a third aspect of the present invention to achieve the aforesaid object, there is provided a semiconductive member for electrophotographic equipment includes the semiconductive composition as at least a part thereof.

The inventors of the present invention conducted intensive studies on a dopant to impart solubility to the polymer with maintaining electrical conductivity of the polymer. As a result, the inventors found that solubility can be imparted to the polymer with maintaining electrical conductivity by using a dopant having 12 to 15 repetitive units of an alkyl group, such as dodecylbenzenesulfonic acid, and filed a Japanese Patent Application for a semiconductive composition including electrically conductive polymer using such a dopant (Japanese Patent Application No. P2002-348350). As a result of the further studies, the inventors found that the dopant is excessively required to obtain the aforesaid electrically conductive polymer, so that electrical resistance varies due to moisture adsorption or the excessive dopant comes up to the surface, which tends to cause contamination due to bleeding. Thus, the inventors further continued their studies and found that when the aforesaid alkylbenzenesulfonic acid or its salt having 2 or more alkyl substituent groups, wherein a total carbon number of the alkyl substituent groups is 10 to 37, is used as a dopant, there is no need to use the dopant excessively so as to solve the aforesaid problem, and the electrically conductive polymer superior both in electrical conductivity and solubility, and attained the present invention.

The inventive electrically conductive polymer is obtained by imparting electrical conductivity to a pi-electron conjugated polymer by means of a dopant; the dopant comprises an alkylbenzenesulfonic acid or its salt having 2 or more alkyl substituent groups, wherein a total carbon number of the alkyl substituent groups is 10 to 37. Thus, since the inventive electrically conductive polymer uses a special dopant, an excessive amount of the dopant is not required, differently from the conventional methods, the inventive electrically conductive polymer is excellent both in electrical conductivity and solubility.

Since the inventive semiconductive composition is a combination of the aforesaid specific electrically conductive polymer and the non-conjugated polymer, a variety of properties can be imparted to the aforesaid specific electrically conductive polymer.

Since the inventive semiconductive member for electrophotographic equipment is especially used as a part of constituting members of electrophotographic equipment, the aforesaid properties can be imparted to electrophotographic equipment such as a charging roll.

DESCRIPTION OF THE PREFERRED EMBODIMENTS

The present invention will hereinafter be described in detail by way of embodiments thereof.

An electrically conductive polymer according to the present invention is a solvent soluble electrically conductive polymer produced by imparting electrical conductivity to a pi-electron conjugated polymer by means of a dopant.

The main feature of the present invention is that the dopant comprises an alkylbenzenesulfonic acid or its salt having 2 or more alkyl substituent groups, wherein a total carbon number of the alkyl substituent groups is 10 to 37.

The monomer for constituting the pi-electron conjugated polymer is not specifically limited, however, examples thereof may include aniline, pyrrole, thiophene and their derivatives, which are used either alone or in combination. Alternatively, they may have a short-chain alkyl substituent group or alkoxy substituent group having a carbon number of 1 to 4 and are preferred in terms of solubility to solvents and compatibility as a composition. Among these monomers, an aniline derivative is preferably used in terms of solubility and reactivity in polymerization.

The specific alkylbenzenesulfonic acid or its salt is required to have two or more alkyl substituent groups wherein a total carbon number of the alkyl substituent groups is 10 to 37. Particularly, alkylbenzenesulfonic acids or their salts having 16 to 30 carbon atoms are preferred. When the total carbon number is less than 10, an excessive amount of the dopant is required to obtain sufficient solubility, so that electrical resistance varies due to moisture adsorption or the excessive dopant comes up to the surface, which tends to cause contamination due to bleeding. On the other hand, when the total carbon number is over 37, the thus obtained electrically conductive polymer becomes waxy so that it tends to be difficult to be dissolved in a solvent. Further, a carbon number of one alkyl substituent group is preferably 2 to 18, more preferably 4 to 15.

Further, the specific alkylbenzenesulfonic acid or its salt may preferably have at least one alkyl substituent group having 4 to 18 carbon atoms in terms of reactivity, solubility and compatibility with an elastomer.

Still further, the specific alkylbenzenesulfonic acid or its salt may have two or more alkyl substituent groups wherein a total carbon number of the alkyl substituent groups is 10 to 37. Specifically, it may be a mixture of two or more combinations selected from the group consisting of the following B1 to B7.

B1: an alkylbenzenesulfonic acid or its salt having a methyl group ($-CH_3$), a butyl group ($-C_4H_9$) and a pentyl group ($-C_5H_{11}$) (a total carbon number of alkyl substituent groups is 10)

B2: an alkylbenzenesulfonic acid or its salt having two pentyl groups ($-C_5H_{11}$) and a hexyl group ($-C_6H_{13}$) (a total carbon number of alkyl substituent groups is 16)

B3: an alkylbenzenesulfonic acid or its salt having a pentyl group ($-C_5H_{11}$) and two hexyl groups ($-C_6H_{13}$) (a total carbon number of alkyl substituent groups is 17)

B4: an alkylbenzenesulfonic acid or its salt having three hexyl groups ($-C_6H_{13}$) (a total carbon number of alkyl substituent groups is 18)

B5: an alkylbenzenesulfonic acid or its salt having two pentyl groups ($-C_5H_{11}$) and a decyl group ($-C_{10}H_{21}$) (a total carbon number of alkyl substituent groups is 20)

B6: an alkylbenzenesulfonic acid or its salt having a decyl group ($-C_{10}H_{21}$) and a pentadecyl group ($-C_{15}H_{31}$) (a total carbon number of alkyl substituent groups is 25)

B7: an alkylbenzenesulfonic acid or its salt having a methyl group ($-CH_3$) and two octadecyl groups ($-C_{18}H_{37}$) (a total carbon number of alkyl substituent groups is 37)

The alkyl substituent group for the alkyl benzenesulfonic acid and its salt is not specifically limited, however, examples thereof may include a methyl group, an ethyl group, a propyl group, a butyl group, a pentyl group, a hexyl group, an octyl group, a nonyl group, a decyl group, an undecyl group, a dodecyl group, a tridecyl group, a tetradecyl group, a pentadecyl group, a hexadecyl group, a heptadecyl group, an oxtadecyl group, a nonadecyl group, an icocyl group, a henicocyl group, a dococyl group, a tricocyl group, a tetracocyl group, a pentacocyl group and a hexacocyl group. These alkyl substituent groups may be branched, however, they are preferably a straight chain in terms of effects. They may be used either alone or in combination. Among them, the alkyl substituent group having 2 to 18 carbon atoms are preferred.

The salt of the alkylbenzenesulfonic acid is not specifically limited, however, examples thereof may include metallic salts such as a sodium salt, a calcium salt and a barium salt; an ammonium salt; and a pyridinium salt, among which a metallic salt is preferably used.

The specific alkylbenzenesulfonic acid or its salt used as the aforesaid dopant may be, for example, produced as follows. After an olefin having 2 to 24 carbon atoms is alkylated to a benzene or an alkylbenzen by a Friedel-Crafts reaction, unreacted matter is withdrawn by distillation and then sulfur trioxide gas is added thereto at a constant flow rate. Thus, the specific alkylbenzenesulfonic acid can be obtained. Further, the specific salt of the alkylbenzenesulfonic acid can be obtained by reacting the thus obtained alkylbenzenesulfonic acid with sodium hydroxide, calcium hydroxide, or the like. The specific alkylbenzenesulfonic acid or its salt used as the aforesaid dopant can be obtained by sulufonating a fraction of oil as a raw material.

As the dopant used for the inventive electrically conductive polymer, a conventional dopant may be employed together with the aforesaid specific alkylbenzenesulfonic acid or its salt. In this case, the amount of the conventional dopant is preferably within 50 mol % of the entire dopant.

Examples of the conventional dopant include halogen, a Lewis acid, a protonic acid, transition metals, halides, salts of transition metals, organic compounds and acceptor ions ($ClO_4^-$, $BF_4^-$) and the like, and compounds including such a conventional dopant as a functional group.

The inventive electrically conductive polymer may be, for example, produced as follows. Exemplary methods include a chemical oxidation polymerization method that oxidation polymerization is conducted between a monomer constituting a pi-electron conjugated polymer and the specific alkylbenzenesulfonic acid or its salt in the presence of an oxidizing agent in water. Further, the methods include an electrolytic polymerization method. Still further, the inventive electrically conductive polymer may be produced by polymerizing a monomer constituting a pi-electron conjugated polymer and then doping the thus obtained polymer, or emulsifying a monomer constituting a pi-electron conjugated polymer and the specific alkylbenzenesulfonic acid or its salt as a dopant in a mixture liquid of an organic solvent and water so as to introduce the dopant into the monomer and then polymerizing the thus obtained monomer. Even still further, the inventive electrically conductive polymer may be produced by making the pi-electron conjugated polymer into an out-of-doping state and then doping the thus obtained polymer by means of the specific alkylbenzenesulfonic acid or its salt.

The oxidizing agent is not specifically limited, however, examples thereof may include ammonium persulfate (APS), peroxides such as hydrogen peroxide solution, and ferric chloride.

The mixture ratio of the pi-electron conjugated polymer (component A) and the specific alkylbenzenesulfonic acid or its salt (component B) is component A/component B=1/0.03 to 1/3 at a molar ratio, particularly preferably component A/component B=1/0.05 to 1/2. When the molar ratio of the component B is low, compatibility with the component A or dispersibility of the component B in the component A tends to deteriorate. When the molar ratio of the component B is high, reactivity deteriorates and an effect for increasing ionic electrically conductivity becomes strong so that electronic conductivity tends to be decreased.

The number average molecular weight (Mn) of the thus obtained inventive electrically conductive polymer is preferably in the range of 1,000 to 100,000, particularly preferably in the range of 3,000 to 20,000.

The thus obtained electrically conductive polymer is soluble in solvents such as tetrahydrofuran (THF), diethylether, acetone, methylethyl ketone, ethyl acetate, m-cresol, N-methyl-2-pyrrolidone (NMP) and toluene.

The inventive electrically conductive polymer preferably has solubility of not less than 1.5% in a solvent having a boiling point of not more than 100° C., particularly preferably not less than 3%. The polymer with such solubility is preferred in terms of coating property and controllability of film thickness when blending with other polymer. Examples of solvents having a boiling point of not more than 100° C. include diethylether, tetrahydrofuran (THF), dipropylether, tetrahydropyran, acetone, methylethyl ketone and ethyl acetate.

The inventive electrically conductive polymer preferably has an electrical resistance of $10^1$ to $10^8$ Ω·cm, particularly preferably of $10^2$ to $10^5$ Ω·cm. When the electrical resistance is less than $10^1$ Ω·cm, controllability of electrical resistance deteriorates in the middle range of electrical resistance in the case where the electrically conductive polymer is used as a composition. When the electrical resistance is over $10^8$ Ω·cm, effect for imparting electrical conductivity tends to be reduced.

The aforesaid electrical resistance may be, for example, measured by the following method. After the electrically conductive polymer is mixed with a solvent such as THF and is ultrasonically treated, supernatant is withdrawn by centrifugalization. The supernatant is cast on a SUS plate by means of an applicator and is dried (for example, at 100° C. for 30 minutes) so that a coat (having a thickness of 5 μm) is formed. The electrical resistance of the thus obtained coat is measured at conditions of 25° C.×50% RH with an applied voltage of 1V in accordance with SRIS 2304.

Now, the semiconductive composition using the inventive electrically conductive polymer will be described hereinafter.

The inventive semiconductive composition may be obtained by using the aforesaid electrically conductive polymer and the non-conjugated polymer.

Examples of the non-conjugated polymer used with the electrically conductive polymer include acrylic resins, urethane resins, fluorine resins, polyimide resins, epoxy resins, urea resins, rubber polymers and thermoplastic elasomers, which may be used either alone or in combination. Among them, acrylic resins, urethane resins, rubber polymers and thermoplastic elastomers are preferred in terms of compatibility with the electrically conductive polymer.

As the aforesaid non-conjugated polymer, those which have a sulfonic acid group or a sulfonate structure in its molecular structure are preferred in terms of compatibility with the electrically conductive polymer. Examples of the sulfonate structure include a metallic salt sulfonate structure, an ammonium salt sulfonate structure and a pyridinium salt sulfonate structure.

The content (amount of a sulfonic acid group) of such a sulfonic acid group or a sulfonate structure in the non-conjugated polymer is preferably 0.001 to 1 mmol/g, particularly preferably 0.01 to 0.2 mmol/g. When the amount of the sulfonic acid group is less than 0.001 mmol/g, compatibility with the electrically conductive polymer tends to deteriorate. When the amount is over 1 mmol/g, physical properties deteriorate because of containing water or ionic electrically conductivity appears.

Examples of the acrylic resins include, for example, polymethyl methacrylate (PMMA), polyethyl methacrylate, polymethyl acrylate, polyethyl acrylate, polybutyl acrylate, polyhydroxy methacrylate, acrylic silicone resins, acrylic fluorine resins, a copolymer obtained by copolymerizing conventional acrylic monomers and acrylic oligomer for photocrosslinking. Those which have a sulfonic acid group or a sulfonate structure introduced in their molecular structures are preferred. Exemplary methods for introduction of such a sulfonic acid group include a radical, an anionic or a cationic copolymerization with a vinyl monomer having sulfonic acid group or a sulfonate structure.

Examples of the urethane resins include ether based resins, ester based resins, acrylic resins and aliphatic resins, and copolymers obtained by copolymerizing silicone based polyols or fluorine polyols therewith. Further, those which have a urea bond or an imide bond in their molecular structures may be used. Those which have a sulfonic acid group or a sulfonate structure introduced in their molecular structures are preferred. Exemplary methods for introduction of such a sulfonic acid group include an urethane reaction or an ester exchange reaction for introducing a diol monomer having a sulfonic acid group therein.

Examples of the fluororesins include polyvinylidene fluoride (PVDF), a vinylidene fluoride-tetrafluoroethylene copolymer and a vinylidene fluoride-tetrafluoroethylene-hexafluoropropylene copolymer. Those which have a sulfonic acid group or a sulfonate structure introduced in their molecular structures are preferred.

Examples of the polyimide resins include polyimide, polyamide-imide (PAI), polyamic acid and silicone imide. Those which have a sulfonic acid group or a sulfonate structure introduced in their molecular structures are preferred.

Examples of epoxy resins include bisphenol-A epoxy resins, epoxy novolak resins, brominated epoxy resins, polyglycol epoxy resin, polyamide containing epoxy resins, silicone-modified epoxy resins, amino-resin containing epoxy resins and alkyd-resin containing epoxy resins. Those which have a sulfonic acid group or a sulfonate structure introduced in their molecular structures are preferred.

The urea resins are not specifically limited as long as they include a urea bond in their molecular structures. Examples thereof may include an urethane urea elastomer, a melamine resin and a urea formaldehyde resin. Those which have a sulfonic acid group or a sulfonate structure introduced in their molecular structures are preferred.

Examples of the rubber polymers include natural rubbers (NR), butadiene rubbers (BR), acrylonitrile-butadiene rubbers (NBR), hydrogenated acrylonitrile-butadiene rubbers (H-NBR), styrene-butadiene rubbers (SBR), isoprene rubbers (IR), urethane rubbers, chloroprene rubbers (CR), chlorinated polyethylene (Cl-PE), epichlorohydrin rubbers (ECO, CO), butyl rubbers (IIR), ethylene-propylene-diene polymer (EPDM) and fluororubbers. Among these polymers, those which have a sulfonic acid group or a sulfonate structure introduced in its molecular structures are preferred.

Examples of the thermoplastic elastomers include styrene thermoplastic elastomers such as styrene-butadiene-styrene block copolymer (SBS) and styrene-ethylene-butylene-styrene block copolymer (SEBS), urethane thermoplastic elastomers (TPU), olefin thermoplastic elastomers (TPO), polyester thermoplastic elastomers (TPEE), polyamide thermoplastic elastomers, fluorine thermoplastic elastomers and polyvinyl chloride thermoplastic elastomers, which may be either alone or in combination. Among them, TPU is preferably used in consideration of easiness of synthetic process and solubility with solvents. Those which have a sulfonic acid group or a sulfonate structure introduced in their molecular structures are preferred.

The number average molecular weight (Mn) of the non-conjugated polymer is preferably in the range of 500 to 2,000,000, particularly preferably in the range of 2,000 to 800,000.

The non-conjugated polymer and the electrically conductive polymer are mixed in an after-mentioned manner so as to be made into a semiconductive composition. The mixture ratio between a raw material of the electrically conductive polymer (a total amount of the pi-electron conjugated polymer and the specific alkylbenzenesulfonic acid or its salt) and the non-conjugated polymer is preferably the raw material of the electrically conductive polymer/the non-conjugated polymer=1/99 to 40/60 by weight, particularly preferably 4/96 to 35/65. When the weight ratio is less than 1, an effect for imparting electrical conductivity tends to be decreased. When the weight ratio is over 40, the resulting composition tends to be hard and brittle and the physical properties of the thus obtained composition may deteriorate.

Further, the inventive semiconductive composition may include an ionic electrically conductive agent, an electronic conductive agent or a crosslinking agent, according to the case, in addition to the electrically conductive polymer and the non-conjugated polymer.

Examples of the ionic electrically conductive agent include lithium perchlorate, quaternary ammonium salt and a compound which ionic-dissociates in a polymer such as borate. These are used either alone or in combination.

The mixing ratio of the ionic conductive agent is preferably 0.01 to 5 parts by weight (just abbreviated to "parts", hereinafter), particularly preferably 0.5 to 2 parts, based upon 100 parts of the total amount of the electrically conductive polymer material and the non-conjugated polymer in terms of physical properties and an electrical property.

Examples of the electronic conductive agent include carbon black, c-ZnO (electrically conductive zinc oxide), c-TiO$_2$ (electrically conductive titanium dioxide), c-SnO$_2$ (electrically conductive stannous dioxide) and graphite.

The mixing ratio of the electronic conductive agent is preferably 5 to 30 parts, particularly preferably 8 to 20 parts based upon 100 parts of the total amount of the electrically conductive polymer material and the non-conjugated polymer in terms of physical properties and an electrical property.

Examples of the crosslinking agent include sulfur, an isocyanate, a blocked isocyanate, urea resins such as melamine, an epoxy hardener, a polyamine hardener, a hydrosilyl hardener and a peroxide. Further, a photo-initiator for crosslinking with energy such as ultraviolet rays or electron rays may be used with the aforesaid crosslinking agent.

The mixing ratio of the crosslinking agent is preferably 1 to 30 parts, particularly preferably 3 to 10 parts based upon 100 parts of the total amount of the electrically conductive polymer material and the non-conjugated polymer in terms of physical properties, adhesion and liquid storage stability.

In addition to the aforesaid components, a cross-linking accelerator, an anti-aging agent and the like may be blended in the semiconductive composition as required.

Examples of the cross-linking accelerator include sulfenamide cross-linking accelerator, a platinum compound, an amine catalyst and conventional cross-linking accelerator such as dithiocarbamate.

The semiconductive composition can be produced as follows. The conductive polymer is produced by the method as described above. Then, the non-conjugated polymer as well as the ionic electrically conductive agent, the electronic conductive agent and the cross-linking agent, if necessary, are blended to the conductive polymer. The semiconductive composition can be obtained by kneading the mixture using a kneading machine such as a roll, a kneader or a Banbury mixer, alternatively, by dissolving the mixture in a solvent so as to be dispersed in the solvent by means of a bead mill or a three-roll mill.

Examples of the solvent include m-cresol, methanol, methylethyl ketone (MEK), toluene, tetrahydrofuran (THF), acetone, ethyl acetate, dimethylformamide (DMF) and N-methyl-2-pyrrolidone (NMP).

The inventive semiconductive composition may be made into a film by coating a coat obtained by dissolving the electrically conductive polymer, the non-conjugated polymer and the like in a solvent, as mentioned above. However, the method is not limited thereto and includes an extrusion method, an injection molding method, an inflation molding method.

The semiconductive composition preferably has an electrical resistance of $10^5$ to $10^{11}$ Ω·cm, particularly preferably of $10^6$ to $10^{10}$ Ω·cm at conditions of 25° C.×50% RH with an applied voltage of 10V. When the electrical resistance is less than $10^5$ Ω·cm, the electrical resistance is too low, so that merits of using the semiconductive composition for imparting to photographic images as a member for the electrophotographic equipment tend to be reduced in terms of electric charge supply to a toner or charging property to a photoreceptor. When the electrical resistance is over $10^{11}$ Ω·cm, the electrical resistance is too high, so that charge-up tends to occur, resulting in difficult control of the electrophotographic equipment.

Now, the semiconductive member for the electrophotographic equipment using the inventive semiconductive composition will be described hereinafter.

The inventive semiconductive member for the electrophotographic equipment can be obtained by using the aforesaid semiconductive composition for at least a part of (all or a part of) the semiconductive member. Examples of the electrophotographic equipment include conductive rolls such as a developing roll, a charging roll, a transfer roll, a toner supply roll and a conductive belt such as an intermediate transcription belt and a sheet feeding belt, and the inventive semiconductive composition is used for at least a part of layers for constituting the above-mentioned member. When the inventive semiconductive composition is used for at least a part of the constituent layers of the semiconductive member, voltage dependence and environment dependence of the electrical resistance are decreased in the constituent layers using the inventive semiconductive composition, and thus the other constituent layers are less subject to receive the affects of voltage dependence and environment dependence of the electrical resistance. As a result, voltage dependence and environment dependence of the electrical resistance are reduced as a whole of the semiconductive member for electrophotographic equipment, so that density unevenness and the other defects are reduced for obtaining good uniform copied images and improving other capabilities for electrophotographic equipment.

Next, an explanation will be given to examples and comparative examples.

EXAMPLE 1

A polymer was obtained by putting 1 mol of aniline as a monomer for constituting a pi-electron conjugated polymer, 1 mol of a sodium salt of an alkylbenzenesulfonic acid represented by the following formula (1) as a dopant (wherein 3 alkyl substituent groups are included and a total carbon number of the alkyl substituent groups is 20) and 2,000 ml of a mixture solvent of 1N of hydrochloric acid and methylisobutyl ketone (MIBK) (at a mixing ratio of hydrochloric acid/MIBK=2/1) into a flask, and spending one hour with dropping 1 mol of ammonium persulfate as an oxidizing agent while controlling the temperature at 5 to 10° C., and then conducting oxidative polymerization for 10 hours. The thus obtained polymer was cleansed by water, methanol and acetone, respectively for purification for obtaining an electrically conductive polymer.

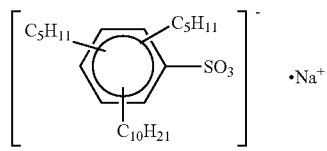

(1)

EXAMPLE 2

An electrically conductive polymer was obtained in substantially the same manner as in Example 1, except that 1 mol of o-toluidine was employed instead of 1 mol of aniline.

EXAMPLE 3

An electrically conductive polymer was obtained in the same manner as in Example 1, except that 1 mol of o-toluidine was employed instead of 1 mol of aniline and 1 mol of a calcium salt of an alkylbenzenesulfonic acid represented by the following formula (2) (wherein 3 alkyl substituent groups are included and a total carbon number of the alkyl substituent groups is 20) was employed instead of 1 mol of a sodium salt of an alkylbenzenesulfonic acid represented by the above-mentioned formula (1).

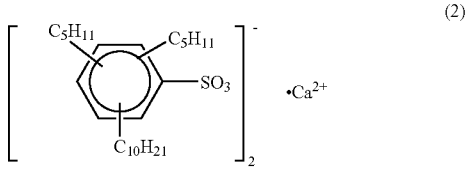

(2)

EXAMPLE 4

An electrically conductive polymer was obtained in substantially the same manner as in Example 1, except that 1 mol of o-toluidine was employed instead of 1 mol of aniline and 1 mol of a barium salt of an alkylbenzenesulfonic acid represented by the following formula (3) (wherein 3 alkyl substituent groups are included and a total carbon number of the alkyl substituent groups is 20) was employed instead of 1 mol of a sodium salt of an alkylbenzenesulfonic acid represented by the above-mentioned formula (1).

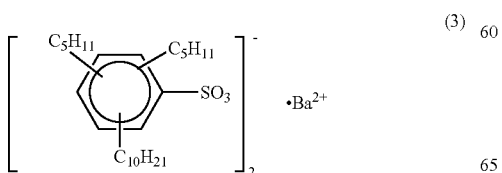

(3)

EXAMPLE 5

An electrically conductive polymer was obtained in substantially the same manner as in Example 1, except that 1 mol of o-anisidine was employed instead of 1 mol of aniline.

EXAMPLE 6

An electrically conductive polymer was obtained in substantially the same manner as in Example 1, except that 1 mol of sec-butyl aniline was employed instead of 1 mol of aniline.

EXAMPLE 7

An electrically conductive polymer was obtained by putting 1 mol of pyrrole as a monomer for constituting a pi-electron conjugated polymer, 1 mol of a sodium salt of an alkylbenzenesulfonic acid represented by the above-mentioned formula (1) as a dopant and 1,500 ml of chloroform into a flask, and spending one hour with dropping 3 mol of ferric chloride as an oxidizing agent while controlling the temperature at 5 to 10° C., and then conducting oxidative polymerization for 10 hours.

EXAMPLE 8

An electrically conductive polymer was obtained in substantially the same manner as in Example 7, except that 1 mol of thiophene was employed instead of 1 mol of pyrrole.

EXAMPLE 9

A polymer was obtained by putting 1 mol of o-toluidine as a monomer for constituting a pi-electron conjugated polymer, 1 mol of a sodium salt of an alkylbenzenesulfonic acid represented by the following formula (4) as a dopant (wherein 3 alkyl substituent groups are included and a total carbon number of the alkyl substituent groups is 10) and 1,800 ml of a mixture solvent of 1N of hydrochloric acid, toluene and methylethyl ketone (MEK) (at a mixing ratio of hydrochloric acid/toluene/MEK=4/1/1) into a flask, and spending one hour with dropping 1.2 mol of ammonium persulfate as an oxidizing agent while controlling the temperature at 5 to 10° C., and then conducting oxidative polymerization for 10 hours. The thus obtained polymer was cleansed by water, methanol and acetone, respectively for purification for obtaining an electrically conductive polymer.

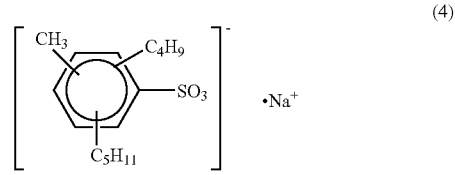

(4)

EXAMPLE 10

An electrically conductive polymer was obtained in substantially the same manner as in Example 9, except that a sodium salt of an alkylbenzenesulfonic acid represented by the following formula (5) (wherein 3 alkyl substituent groups are included and a total carbon number of the alkyl substituent groups is 37) was employed instead of a sodium salt of an alkylbenzenesulfonic acid represented by the above-mentioned formula (4).

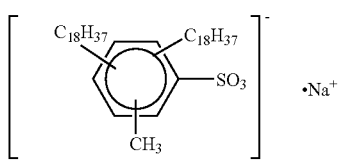

(5)

EXAMPLE 11

An electrically conductive polymer was obtained in substantially the same manner as in Example 9, except that a sodium salt of an alkylbenzenesulfonic acid represented by the following formula (6) (wherein 2 alkyl substituent groups are included and a total carbon number of the alkyl substituent groups is 16) was employed instead of a sodium salt of an alkylbenzenesulfonic acid represented by the above-mentioned formula (4).

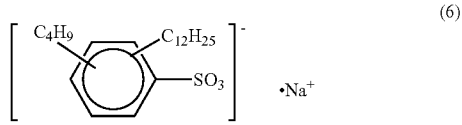

(6)

COMPARATIVE EXAMPLE 1

A polymer was obtained in substantially the same manner as in Example 1, except that 2 mol of an alkylbenzenesulfonic acid having an alkyl substituent group wherein a total carbon number is 15 (pentadecylbenzene sulfonate) was employed instead of 1 mol of a sodium salt of an alkylbenzenesulfonic acid represented by the above-mentioned formula (1). The thus obtained polymer was cleansed by water, and mixed with toluene, and then filtrated to remove precipitate for obtaining an electrically conductive polymer (toluene solution).

COMPARATIVE EXAMPLE 2

An electrically conductive polymer was obtained in substantially the same manner as in Example 1, except that 1 mol of an alkylbenzenesulfonic acid having an alkyl substituent group wherein a total carbon number is 27 (heptacosylbenzene sufonic acid) was employed instead of 1 mol of a sodium salt of an alkylbenzenesulfonic acid represented by the above-mentioned formula (1).

The electrically conductive polymers of the Examples and the Comparative Examples thus produced were evaluated for characteristic properties thereof in the following manners. The results of the evaluation are shown in Tables 1 and 2.

Solubility

Each solubility of the electrically conductive polymers was measured relative to THF, diethylether, m-cresol and NMP. In addition, toluene was volatilized and dried for obtaining a dried sample, which was used for evaluation in Comparative Example 1.

Electrical Resistance (Initial)

After an electrically conductive polymer was mixed with THF and was ultrasonically treated, supernatant was withdrawn by centrifugalization (20,000 rpm). The supernatant was cast on a SUS plate by means of an applicator and was dried (at 100° C. for 30 minutes) so that a coat (having a thickness of 5 μm) was formed The electrical resistance of the thus obtained coat was measured at conditions of 25° C.×50% RH with an applied voltage of 1V in accordance with SRIS 2304. In addition, casting was conducted in a state of a toluene solution in Comparative Example 1.

Variation of Digits after Ozone Environment

After the thus obtained coat was allowed to stand under ozone environment of 50° C.×80 pphm for 1 month, electrical resistance was measured in the same manner as the above-mentioned. Then, the variation of digits was obtained.

Variation of Digits after Wet-Heat Environment

After the thus obtained coat was allowed to stand under wet-heat environment of 50° C.×95% RH for 1 month, electrical resistance was measured in the same manner as the above-mentioned. Then, the variation of digits was obtained.

Bleed

Each electrically conductive polymer was used for producing a coat in the same manner as the above-mentioned. The thus obtained coat was evaluated both by visually observation and by touching it. The symbol ○ indicates that no bleeding occurred and the symbol X indicates that bleeding occurred in the following Tables 1 and 2.

TABLE 1

| | Example | | | | | | |
|---|---|---|---|---|---|---|---|
| | 1 | 2 | 3 | 4 | 5 | 6 | 7 |
| Solubility (%) | | | | | | | |
| THF | 1.5 | 5.2 | 6.3 | 6.1 | 3.3 | 8.9 | 2.6 |
| diethylether | 1.7 | 4.5 | 6.5 | 5.9 | 3.1 | 9.5 | 2.8 |
| m-cresol | 1.1 | 2.5 | 2.8 | 3.8 | 2.8 | 11.3 | 2.1 |
| NMP | 2.7 | 8.3 | 9.2 | 9.5 | 5.2 | 14.2 | 3.3 |
| Electrical resistance | | | | | | | |
| Initial (Ω · cm) | $1.2 \times 10^1$ | $5.0 \times 10^2$ | $2.0 \times 10^2$ | $6.0 \times 10^2$ | $4.0 \times 10^2$ | $6.0 \times 10^7$ | $3.0 \times 10^3$ |
| Variation of digit after ozone environment (digit) | 0.20 | 0.25 | 0.21 | 0.21 | 0.19 | 0.28 | 0.12 |
| Variation of digit after wet-heat condition (digit) | 0.15 | 0.13 | 0.14 | 0.13 | 0.13 | 0.22 | 0.08 |
| Bleed | ○ | ○ | ○ | ○ | ○ | ○ | ○ |

TABLE 2

|  | Example | | | | Comparative Example | |
| --- | --- | --- | --- | --- | --- | --- |
|  | 8 | 9 | 10 | 11 | 1 | 2 |
| Solubility (%) | | | | | | |
| THF | 1.8 | 1.6 | 3.2 | 3.7 | 1.5 | 0.02 |
| diethylether | 2.2 | 1.8 | 3.1 | 4.0 | 1.4 | 0.01 |
| m-cresol | 2.6 | 1.8 | 2.6 | 4.2 | 1.8 | 0.02 |
| NMP | 2.5 | 1.7 | 4.5 | 4.6 | 2.1 | 0.02 |
| Electrical resistance | | | | | | |
| Initial ($\Omega \cdot cm$) | $8.0 \times 10^3$ | $3.0 \times 10^2$ | $2.0 \times 10^3$ | $8.0 \times 10^2$ | $3.0 \times 10^1$ | $1.3 \times 10^1$ |
| Variation of digit after ozone environment (digit) | 0.11 | 0.41 | 0.25 | 0.16 | 0.19 | 0.20 |
| Variation of digit after wet-heat condition (digit) | 0.07 | 0.19 | 0.19 | 0.15 | 1.28 | 0.18 |
| Bleed | ○ | ○ | ○ | ○ | x | ○ |

As can be understood from the results, the Examples were excellent in solubility and electrical conductivity, and caused no bleeding. Further, excellent effects were obtained in the Examples where an ammonium salt or a pyridinium salt of an alkylbenzenesulfonic acid was used instead of a sodium salt of an alkylbenzenesulfonic acid as a dopnat as in Example 1.

On the other hand, the Comparative Example 1 had solubility to solvents, however, caused bleeding because a dopant was excessively given and purification was insufficient, resulting in bleeding. Since a dopant had a long chain in the Comparative Example 2, which was difficult to be doped to polyaniline, the dopant could substantially not be dissolved to a solvent due to hydrochloric acid of a solution, which worked as a dopant.

Next, electrically conductive compositions were produced using the aforesaid electrically conductive polymers.

EXAMPLE 12

After 85 parts of TPU (E980 available from Nippon Miractran Co., Ltd. of Kanagawa, Japan) as a non-conjugated polymer was dissolved in a mixture of 300 parts of THF, 150 parts of MEK and 100 parts of toluene, a 5% THF solution containing 15 parts of electrically conductive polymer produced in the same manner as in the Example 2 was added thereto. The thus obtained mixture was kneaded by means of a three-roll mill for producing an electrically conductive composition (coating liquid).

EXAMPLE 13

An electrically conductive composition (coating liquid) was obtained in substantially the same manner as in Example 12, except that 80 parts of polymethyl methacrylate (LG6A available from Sumitomo Chemical Co., Ltd. of Tokyo, Japan) was used instead of 85 parts of TPU as a non-conjugated polymer and the amount of electrically conductive polymer produced in the same manner as in the Example 2 was changed to 20 parts.

EXAMPLE 14

After 80 parts of H-NBR (Zetpol 0020 available from Zeon Corporation of Tokyo, Japan) as a non-conjugated polymer, 1 part of crosslinking agent (sulfur), 2 parts of a sulfenamide crosslinking accelerator (NOCCELER CZ available from OUCHISHINKO CHEMICAL INDUSTRIAL CO., LTD. of Tokyo, Japan) and 2 parts of a dithiocarbamate crosslinking accelerator (NOCCELER BZ available from OUCHISHINKO CHEMICAL INDUSTRIAL CO., LTD. of Tokyo, Japan) were kneaded by a two-roll mill. The thus obtained mixture was dissolved in a mixture of 300 parts of THF, 150 parts of MEK and 100 parts of toluene, a 5% THF solution containing 20 parts of electrically conductive polymer produced in the same manner as in the Example 2 was added thereto for obtaining an electrically conductive composition (coating liquid).

EXAMPLE 15

An electrically conductive composition (coating liquid) was obtained in substantially the same manner as in Example 12, except that 80 parts of urethane silicone (X22-2756 available from Shin-Etsu Chemical Co., Ltd. of Tokyo, Japan) was used instead of 85 parts of TPU as a non-conjugated polymer and the amount of electrically conductive polymer produced in the same manner as in the Example 2 was changed to 20 parts.

EXAMPLE 16

An electrically conductive composition (coating liquid) was obtained in substantially the same manner as in Example 12, except that 90 parts of acrylic fluororesin (LFB4015 available from Soken Chemical & Engineering Co., Ltd. of Tokyo, Japan) was used instead of 85 parts of TPU as a non-conjugated polymer and the amount of electrically conductive polymer produced in the same manner as in the Example 2 was changed to 10 parts.

EXAMPLE 17

An electrically conductive composition (coating liquid) was obtained in substantially the same manner as in Example 12, except that 80 parts of TPU having 0.05 mmol/g of sodium sulfonate group in its molecular structure (Nippolan 3312 available from Nippon Polyurethane Industry Co., Ltd. of Tokyo, Japan) was used instead of 85 parts of TPU as a non-conjugated polymer and the amount of electrically conductive polymer produced in the same manner as in the Example 2 was changed to 20 parts.

EXAMPLE 18

Production of Sulfonated Urethane Silicone

A sulfonated urethane silicone (a sodium sulfonate group: 0.01 mmol/g, silicone component: 10%, weight-average molecular weight (Mw): 80,000) was produced by reacting a polyol (Mw: 2,000) obtained by copolymerizing an adipic acid—5-sodium sulfoisophthalate (at a weight ratio of an adipic acid/5-sodium sulfoisophthalate=4/1) and an ethylene glycol, a polyethyleneadipate polyol (Mw: 2,000) and a silicone polyol (Mw: 2,000) by means of MDI.

Production of Electrically Conductive Composition

An electrically conductive composition (coating liquid) was obtained in substantially the same manner as in Example 12, except that 83 parts of the thus obtained sulfonated urethane silicone was used instead of 85 parts of TPU as a non-conjugated polymer and the amount of electrically conductive polymer produced in the same manner as in the Example 2 was changed to 17 parts.

EXAMPLE 19

Production of Sulfonated Acrylic Fluororesin

A sulfonated acrylic fluororesin (an ammonium sulfonate group: 0.02 mmol/g, Mw: 40,000) was produced by copolymerizing a methyl methacrylate-butyl acrylate-perfluorooctylethylene (at a weight ratio of a methyl methacrylate-butyl acrylate-perfluorooctylethylene=8/1/1) and a sulfoethylmethacrylate.

Production of Electrically Conductive Composition

An electrically conductive composition (coating liquid) was obtained in substantially the same manner as in Example 12, except that 90 parts of the thus obtained sulfonated acrylic fluororesin was used instead of 85 parts of TPU as a non-conjugated polymer and the amount of electrically conductive polymer produced in the same manner as in the Example 2 was changed to 10 parts.

EXAMPLE 20

After 70 parts of TPU (E980 available from Nippon Miractran Co., Ltd. of Kanagawa, Japan) as a non-conjugated polymer was dissolved in a mixture of 300 parts of THF, 150 parts of MEK and 100 parts of toluene, 30 parts of electrically conductive polymer produced in the same manner as in the Example 6 was added thereto in such that the thus obtained solution was a 5% solution of THF. The thus obtained mixture was kneaded by means of a three-roll mill for producing an electrically conductive composition (coating liquid).

EXAMPLE 21

After 87 parts of sulfonated urethane silicone produced in the same method as in Example 18 was dissolved in a mixture of 400 parts of THF, 150 parts of MEK and 100 parts of toluene, 13 parts of electrically conductive polymer produced in the same manner as in the Example 9 was added thereto in such that the thus obtained solution was a 5% solution of THF. The thus obtained mixture was kneaded by means of a three-roll mill for producing an electrically conductive composition (coating liquid).

EXAMPLE 22

After 50 parts of sulfonated urethane silicone produced in the same method as in Example 18 was dissolved in a mixture of 300 parts of THF, 150 parts of MEK and 100 parts of toluene, a 5% THF solution containing 50 parts of electrically conductive polymer produced in the same manner as in the Example 10 was added thereto. The thus obtained mixture was kneaded by means of a three-roll mill for producing an electrically conductive composition (coating liquid).

EXAMPLE 23

After 80 parts of sulfonated urethane silicone produced in the same method as in Example 18 was dissolved in a mixture of 300 parts of THF, 150 parts of MEK and 100 parts of toluene, a 5% THF solution containing 20 parts of electrically conductive polymer produced in the same manner as in the Example 11 was added thereto. The thus obtained mixture was kneaded by means of a three-roll mill for producing an electrically conductive composition (coating liquid).

COMPARATIVE EXAMPLE 3

An electrically conductive composition (coating liquid) was obtained in substantially the same manner as in Example 12, except that the amount of TPU as a non-conjugated polymer was changed to 70 parts and 30 parts of an electrically conductive polymer produced in the same manner as in the Comparative Example 1 was used instead of 15 parts of an electrically conductive polymer produced in the same manner as in the Example 2.

COMPARATIVE EXAMPLE 4

An electrically conductive composition (coating liquid) was obtained in substantially the same manner as in Example 12, except that the amount of TPU as a non-conjugated polymer was changed to 98 parts and 2 parts of tetrabutylammonium bromate (TBAB; available from LION corporation of Tokyo, Japan) as an ionic conductive agent was used instead of 15 parts of an electrically conductive polymer produced in the same manner as in the Example 2.

COMPARATIVE EXAMPLE 5

An electrically conductive composition (coating liquid) was obtained in substantially the same manner as in Example 12, except that the amount of TPU as a non-conjugated polymer was changed to 93 parts and 7 parts of acetylene black (DENKABLACK HS100 available from DENKI KAGAKU KOGYO KABUSHIKI KAISHA of Tokyo, Japan) was used instead of 15 parts of an electrically conductive polymer produced in the same manner as in the Example 2.

The electrically conductive compositions of the Examples and the Comparative Examples thus produced were evaluated for characteristic properties thereof in the following manners The results of the evaluation are shown in Tables 3 to 5.

Electrical Resistance and Voltage Dependency

Each electrically conductive composition (coating liquid) was applied on a SUS304 plate, and was dried at 120° C. for 30 minutes for producing an electrically conductive coating film having a thickness of 30 μm. Each electrical resistance of the conductive coating film at an applied voltage of 10V (Rv=10V) and 100V (Rv=100V) was measured in accordance with SRIS 2304 under an environment of 25° C.×50%

RH. Then, voltage dependency of the electrical resistance was indicated by variation of digits obtained from Log (Rv=10V/Rv=100V).

Environment Dependency of Electrical Resistance

The electrically conductive coating film was produced in the same manner as described above by using each electrically conductive composition (coating liquid). The electrical resistance of the thus obtained conductive coating film under a low temperature—low humidity (15° C.×10% RH) environment (Rv=15° C.×10% RH), and the electrical resistance of the thus obtained conductive coating film under a high temperature—high humidity (35° C.×85% RH) environment (Rv=35° C.×85% RH) were measured at an applied voltage of 10V in accordance with SRIS 2304. The environment dependency of the electrical resistance was indicated by variation of digits obtained from Log ((Rv=15° C.×10% RH)/(Rv=35° C.×85% RH).

Variation of Digits of Electrical Resistance Due to Environment

The electrically conductive coating film was produced in the same manner as described above by using each electrically conductive composition (coating liquid) The electrical resistance of the thus obtained conductive coating film was measured in accordance with SRIS2304 under 25° C.×50% RH environment at an applied voltage of 10V before (Rv=0 day)/after the thus obtained conductive coating film was allowed to stand under 50° C.×95% RH environment for 100 days (Rv=100 days). The variation of digits of electrical resistance due to environment was obtained from Log (Rv=100 days/Rv=0 day).

Electrical Resistance Variation (Charge-Up) in High Voltage Range

The electrically conductive coating film was produced in the same manner as described above by using each electrically conductive composition (coating liquid). The electrical resistance of the thus obtained conductive coating film under 25° C.×50% RH environment at an applied voltage of 100V (Rv=0 sec), and the electrical resistance of the thus obtained conductive coating film under 25° C.×50% RH environment at an applied voltage of 100V for 10 minutes (Rv=600 sec) were measured in accordance with SRIS 2304. The electrical resistance variation in high voltage range was indicated by variation of digits obtained from Log (Rv=600 sec/Rv=0 sec).

TABLE 3

| | Example | | | | | | |
|---|---|---|---|---|---|---|---|
| | 12 | 13 | 14 | 15 | 16 | 17 | 18 |
| Electrical resistance ($\Omega \cdot cm$) | | | | | | | |
| 10 V | $4.1 \times 10^8$ | $5.0 \times 10^8$ | $6.0 \times 10^7$ | $1.5 \times 10^7$ | $6.8 \times 10^9$ | $8.0 \times 10^9$ | $9.0 \times 10^9$ |
| 100 V | $1.8 \times 10^8$ | $1.9 \times 10^8$ | $2.3 \times 10^7$ | $4.8 \times 10^6$ | $2.3 \times 10^9$ | $6.0 \times 10^9$ | $6.0 \times 10^9$ |
| Voltage dependency of electrical resistance (digit) | 0.36 | 0.42 | 0.42 | 0.49 | 0.47 | 0.12 | 0.18 |
| Environment dependency of electrical resistance (digit) | 0.3 | 0.3 | 0.25 | 0.3 | 0.25 | 0.3 | 0.3 |
| Variation of digits of electrical resistance due to environment (digit) | 0.4 | 0.5 | 0.4 | 0.5 | 0.5 | 0.3 | 0.3 |
| Charge-up (digit) | 0.4 | 0.4 | 0.4 | 0.4 | 0.4 | 0.3 | 0.3 |

TABLE 4

| | Example | | | | |
|---|---|---|---|---|---|
| | 19 | 20 | 21 | 22 | 23 |
| Electrical resistance ($\Omega \cdot cm$) | | | | | |
| 10 V | $3.2 \times 10^9$ | $8.0 \times 10^{10}$ | $6.0 \times 10^8$ | $2.0 \times 10^{10}$ | $4.0 \times 10^7$ |
| 100 V | $1.8 \times 10^9$ | $6.0 \times 10^{10}$ | $1.2 \times 10^8$ | $1.5 \times 10^{10}$ | $2.5 \times 10^7$ |
| Voltage dependency of electrical resistance (digit) | 0.25 | 0.12 | 0.7 | 0.12 | 0.20 |
| Environment dependency of electrical resistance (digit) | 0.3 | 0.3 | 0.25 | 0.3 | 0.2 |
| Variation of digits of electrical resistance due to environment (digit) | 0.3 | 0.5 | 0.3 | 0.4 | 0.3 |
| Charge-up (digit) | 0.3 | 0.5 | 0.3 | 0.5 | 0.3 |

TABLE 5

| | Comparative Example | | |
|---|---|---|---|
| | 3 | 4 | 5 |
| Electrical resistance ($\Omega \cdot cm$) | | | |
| 10 V | $3.0 \times 10^8$ | $5.0 \times 10^8$ | $8.0 \times 10^8$ |
| 100 V | $1.2 \times 10^8$ | $7.0 \times 10^8$ | $2.0 \times 10^6$ |

TABLE 5-continued

|  | Comparative Example | | |
|---|---|---|---|
|  | 3 | 4 | 5 |
| Voltage dependency of electrical resistance (digit) | 0.40 | −0.15 | 2.60 |
| Environment dependency of electrical resistance (digit) | 0.5 | 2.6 | 0.05 |
| Variation of digits of electrical resistance due to environment (digit) | 4.3 | 0.1 | 0.08 |
| Charge-up (digit) | 0.25 | 2.9 | 0.09 |

As can be understood from the results, the Examples were excellent in voltage dependency of the electrical resistance and environment dependency of the electrical resistance, and had small electrical resistance variation due to environment. Further, the increment (charge-up) of each electrical resistance in high voltage range of the Examples was very small.

On the other hand, the Comparative Example 3 had great electrical resistance variation due to environment. Since the Comparative Example 4 employed an ionic electrically conductive agent, it was inferior in environment dependency of the electrical resistance and increment of the electrical resistance in high voltage range was great. Since the Comparative Example 5 employed an electronic conductive agent, it was inferior in voltage dependency of the electrical resistance.

Next, charging rolls were produced by using the aforesaid electrically conductive composition.

EXAMPLE 24

Preparation of Base Layer Material

Silicone rubber with carbon black dispersed therein (KE1350AB available from Shin-Etsu Chemical Co., Ltd. of Tokyo, Japan) was prepared.

Preparation of Surface Layer Material

An electrical conductive composition was prepared in the same manner as in Example 13.

Production of Charging Roll

A metal shaft (composed of SUS304 and having a diameter of 10 mm) was set in a mold for injection molding, and the base layer material was injected into the mold and heated at 150° C. for 45 minutes. The resulting product was unmolded. Thus, a base layer (having a thickness of 3 mm) was formed around the shaft. Then, the surface layer material was applied on the peripheral surface of the base layer, whereby a surface layer (having a thickness of 50 μm) was formed. Thus, a charging roll having a two-layer structure was produced, which included the base layer provided around the shaft and the surface layer provided on the peripheral surface of the base layer.

EXAMPLE 25

Preparation of Intermediate Layer Material

An electrically conductive composition was produced in the same manner as in Example 13.

Preparation of Surface Layer Material

An electrically conductive composition was produced in the same manner as in Comparative Example 5.

Production of Charging Roll

A charging roll having a three-layer structure, wherein a base layer having a thickness of 3 mm was formed on an outer peripheral surface of the shaft, an intermediate layer having a thickness of 45 μm was formed on an outer peripheral surface of the base layer, and further a surface layer having a thickness of 5 μm was formed on an outer peripheral surface of the intermediate layer, was produced in substantially the same manner as in Example 24, except that the electrically conductive compositions described above were employed as the intermediate layer material and the surface layer material.

EXAMPLE 26

Preparation of Intermediate Layer Material

An electrically conductive composition was produced in the same manner as in Example 22.

Preparation of Surface Layer Material

An electrically conductive composition was produced in the same manner as in Comparative Example 5.

Production of Charging Roll

A charging roll having a three-layer structure, wherein a base layer having a thickness of 3 mm was formed on an outer peripheral surface of the shaft, an intermediate layer having a thickness of 20 μm was formed on an outer peripheral surface of the base layer, and further a surface layer having a thickness of 30 μm was formed on an outer peripheral surface of the intermediate layer, was produced in substantially the same manner as in Example 24, except that the electrically conductive compositions described above were employed as the intermediate layer material and the surface layer material.

COMPARATIVE EXAMPLE 6

Preparation of Base Layer Material

Silicone rubber with carbon black dispersed therein (KE1350AB available from Shin-Etsu Chemical Co., Ltd. of Tokyo, Japan) was prepared.

Preparation of Surface Layer Material

An electrical conductive composition was prepared in the same manner as in Comparative Example 5.

Production of Charging Roll

A charging roll having a two-layer structure, wherein a base layer having a thickness of 3 mm was formed on an outer peripheral surface of the shaft and a surface layer having a thickness of 50 μm was formed on an outer peripheral surface of the base layer, was produced by employing the base layer material and the surface layer material as described above.

COMPARATIVE EXAMPLE 7

Preparation of Intermediate Layer Material

An electrically conductive composition was produced in the same manner as in Comparative Example 4.

Preparation of Surface Layer Material

An electrically conductive composition was produced in the same manner as in Comparative Example 5.

Production of Charging Roll

A charging roll having a three-layer structure, wherein a base layer having a thickness of 3 mm was formed on an outer peripheral surface of the shaft, an intermediate layer having a thickness of 20 μm was formed on an outer peripheral surface of the base layer, and further a surface layer having a thickness of 30 m was formed on an outer peripheral surface of the intermediate layer, was produced in substantially the same manner as in Example 24, except that the electrically conductive compositions as described above were employed as the intermediate layer material and the surface layer material.

The charging rolls of the Examples and the Comparative Examples thus produced were evaluated for characteristic properties thereof in the following manners. The results of the evaluation are shown in Table 6.

Electrical Resistance and Voltage Dependency of Electrical Resistance

A surface of the charging roll was pressed against a SUS plate while opposite ends of the charging roll were each applied with a load of 1 kg, and then an electrical resistance between the shaft and the plate was measured in conformity with the method specified in SRIS 2304. At this time, each electrical resistance was measured at an applied voltage of 10V (Rv=10V) and an applied voltage of 100V (Rv-100V), under conditions of 25° C.×50% RH. Then, the voltage dependency of the electrical resistance was indicated by the variation of digits obtained from Log (Rv=10V/Rv=100V).

Environment Dependency of Electrical Resistance

The electrical resistance of the thus obtained charging roll under a low temperature—low humidity (15° C.×10% RH) environment (Rv=15° C.×10% RH), and the electrical resistance of the thus obtained charging roll under a high temperature—high humidity (35° C.×85% RH) environment (Rv=35° C.×85% RH) were measured at an applied voltage of 10V in accordance with SRIS 2304. The environment dependency of the electrical resistance was indicated by variation of digits obtained from Log ((Rv=15° C.×10% RH)/(Rv=35° C.×85% RH)

Hardness (JIS A)

The hardness of the outermost surface of each charging roll was measured in accordance with JIS K 6253.

Compression Set

The compression set of each charging roll was measured at 70° C. for 22 hours under condition of 25% compression ratio in accordance with JIS K 6262.

Charging Roll Characteristics Image Uniformity

The charging rolls were each incorporated in a commercially available color printer, and an output image (halftone image) was evaluated under environment of 20° C.×50% RH. For the evaluation of the charging roll characteristics in Table 6, a symbol ○ indicates that the halftone image was free from density inconsistency, thin line discontinuation and color misregistration, and a symbol X indicates that the halftone image suffered from density inconsistency.

Variation of Image Quality Due to Environment

The charging rolls were each incorporated in a commercially available color printer, and variation of image quality was evaluated by comparing an output image under environment of 15° C.×10% RH with an output image under 35° C.×85% RH. For the evaluation of the variation in Table 6, a symbol ○ indicates that the difference between black images printed was not more than 0.1, and a symbol X indicates that the difference between black images printed was greater than 0.1 by means of Macbeth concentration meter.

Concentration Variety Due to Charge-Up

The charging rolls were each incorporated in a commercially available color printer, and 10,000 copies were printed under environment of 25° C.×50% RH. For the evaluation of concentration variety in Table 6, a symbol ○ indicates that the difference of halftone after 10,000 outputs was not identified (or less than 0.1 by means of Macbeth concentration meter), and a symbol X indicates that the difference was identified (or not more than 0.1 by means of Macbeth concentration meter).

Variation of Digit of Electrical Resistance Due to Environment

First, the electrical resistance of each charging roll was measured with an applied voltage of 10V under 25° C.×50% RH in accordance with SRIS 2304. The charging rolls were each allowed to stand under 50° C.×95% RH for 100 days. The electrical resistance was measured with an applied voltage of 10V under 25° C.×50% RH after 100 days (Rv=100 days) in accordance with SRIS 2304. Then, each variation of digit of electrical resistance was calculated from Log (Rv=100 days/Rv=0 day).

TABLE 6

|  | Example | | | Comparative Example | |
| --- | --- | --- | --- | --- | --- |
|  | 24 | 25 | 26 | 6 | 7 |
| Electrical resistance (Ω) | | | | | |
| 10 V | $8.8 \times 10^6$ | $9.3 \times 10^6$ | $1.5 \times 10^8$ | $1.4 \times 10^7$ | $1.2 \times 10^7$ |
| 100 V | $3.3 \times 10^6$ | $3.0 \times 10^6$ | $1.1 \times 10^8$ | $3.9 \times 10^4$ | $4.9 \times 10^6$ |
| Voltage dependency of electrical resistance (digit) | 0.42 | 0.49 | 0.15 | 2.56 | 0.38 |
| Environment dependency of electrical resistance (digit) | 0.4 | 0.4 | 0.4 | 0.3 | 2.4 |
| Hardness (JIS A) | 28 | 28 | 27 | 26 | 26 |
| Compression set (%) | 6 | 6 | 6 | 6 | 6 |
| Charging roll characteristics | | | | | |
| Image uniformity | ○ | ○ | ○ | X | ○ |
| Variation of image quality due to environment | ○ | ○ | ○ | ○ | X |
| Concentration variation due to charge-up | ○ | ○ | ○ | ○ | X |
| Variation of digits of electrical resistance due to environment (digit) | 0.3 | 0.5 | 0.5 | 0.3 | 0.3 |

As can be understood from the results, the charging rolls of the Examples were superior in charging roll characteristics to the charging rolls of the Comparative Examples.

Next, transfer rolls were produced using the aforesaid electrically conductive compositions.

EXAMPLE 27

Preparation of Base Layer Material

Silicone rubber with carbon black dispersed therein (KE1350AB available from Shin-Etsu Chemical Co., Ltd. of Tokyo, Japan) was prepared.

Preparation of Surface Layer Material

Electrically conductive compositions were produced in substantially the same manner as in Example 19.

Production of Transfer Roll

A transfer roll having a two-layer structure, wherein a base layer having a thickness of 6 mm was formed on an outer peripheral surface of the shaft and a surface layer having a thickness of 50 m was formed on an outer peripheral surface of the intermediate layer, was produced in substantially the same manner as in Example 24, except that materials described above were employed as each layer material.

COMPARATIVE EXAMPLE 8

Preparation of Base Layer Material

Silicone rubber with carbon black dispersed therein (KE1350AB available from Shin-Etsu Chemical Co., Ltd. of Tokyo, Japan) was prepared.

Preparation of Surface Layer Material

An electrical conductive composition was prepared in the same manner as in Comparative Example 4.

Production of Transfer Roll

A transfer roll having a two-layer structure, wherein a base layer having a thickness of 6 mm was formed on an outer peripheral surface of the shaft and a surface layer having a thickness of 50 μm was formed on an outer peripheral surface of the base layer, was produced by using the thus obtained base layer material and the thus obtained surface layer material.

The transfer rolls of the Examples and the Comparative Examples thus produced were evaluated for characteristic properties thereof in the following manners. The results of the evaluation are shown in Table 7.

TABLE 7

|  | Example 27 | Comparative Example 8 |
|---|---|---|
| Electrical resistance (Ω) |  |  |
| 10 V | $2.4 \times 10^7$ | $3.8 \times 10^6$ |
| 100 V | $1.4 \times 10^7$ | $5.3 \times 10^6$ |
| Voltage dependency of electrical resistance (digit) | 0.25 | −0.14 |
| Environment dependency of electrical resistance (digit) | 0.3 | 2.7 |
| Hardness (JIS A) | 26 | 24 |
| Compression set (%) | 6 | 6 |
| Transfer roll characteristics |  |  |
| Image uniformity | ○ | ○ |
| Variation of image quality due to environment | ○ | x |

TABLE 7-continued

|  | Example 27 | Comparative Example 8 |
|---|---|---|
| Concentration variation due to charge-up | ○ | x |
| Variation of digits of electrical resistance due to environment (digit) | 0.5 | 0.4 |

As can be understood from the results, the transfer rolls of the Examples were superior in transfer roll characteristics to the transfer rolls of the Comparative Examples.

Next, transfer belts were produced using the aforesaid electrically conductive compositions.

EXAMPLE 28

Preparation of Base Layer Material

A base layer material was prepared by mixing 100 parts of amide imide (VYLOMAX HR16NN available from Toyobo Co., Ltd. of Tokyo, Japan) and 15 parts of acetylene black (DENKA BLACK HS100 available from DENKI KAGAKU KOGYO KABUSHIKI KAISHA K.K. of Tokyo, Japan).

Preparation of Surface Layer Material

Electrically conductive compositions were produced in substantially the same manner as in Example 19.

Production of Transfer Belt

A transfer belt having a two-layer structure, wherein a surface layer having a thickness of 50 μm was formed on an outer peripheral surface of a base layer having a thickness of 0.3 mm, was produced by employing each material as described above.

COMPARATIVE EXAMPLE 9

Preparation of Surface Layer Material

Electrically conductive compositions were produced in substantially the same manner as in Comparative Example 4.

Production of Transfer Belt

A transfer belt having a two-layer structure, wherein a surface layer having a thickness of 50 μm was formed on an outer peripheral surface of a base layer having a thickness of 0.3 mm, was produced in substantially the same manner as in Example 28, except that the aforesaid surface layer material was used.

The transfer belts of the Examples and the Comparative Examples thus produced were evaluated for characteristic properties thereof in the above-mentioned manners for the charging roll properties. The results of the evaluation are shown in Table 8. Further, the electrical resistance of the transfer belt was measured by putting a SUS rod having a 10 mm diameter and a weight of 1 kg inside the transfer belt and measuring the electrical resistance between a portion contacting this SUS rod and a SUS plate in accordance with SRIS 2304.

TABLE 8

|  | Example 28 | Comparative Example 9 |
|---|---|---|
| Electrical resistance (Ω) | | |
| 10 V | $8.1 \times 10^8$ | $1.3 \times 10^8$ |
| 100 V | $4.5 \times 10^8$ | $1.8 \times 10^8$ |
| Voltage dependency of electrical resistance (digit) | 0.25 | −0.12 |
| Environment dependency of electrical resistance (digit) | 0.3 | 2.8 |
| Hardness (JIS A) | — | — |
| Compression set (%) | — | — |
| Transfer belt characteristics | | |
| Image uniformity | ○ | ○ |
| Variation of image quality due to environment | ○ | x |
| Concentration variation due to charge-up | ○ | x |
| Variation of digits of electrical resistance due to environment (digit) | 0.5 | 0.3 |

As can be understood from the results, the transfer belts of the Examples were superior in transfer belt characteristics to the transfer belts of the Comparative Examples.

Next, a developing roll was produced by using the aforesaid electrically conductive compositions in the following manner.

EXAMPLE 29

Preparation of Base Layer Material
Silicone rubber with carbon black dispersed therein (KE1350AB available from Shin-Etsu Chemical Co., Ltd. of Tokyo, Japan) was prepared.

Preparation of Intermediate Layer Material
An electrical conductive composition was prepared in the same manner as in Comparative Example 5.

Preparation of Surface Layer Material
An electrical conductive composition was prepared in the same manner as in Example 12.

Production of Developing Roll
A developing roll, wherein a base layer having a thickness of 4 mm was formed on an outer peripheral surface of the shaft, an intermediate layer having a thickness of 5 μm was formed on an outer peripheral surface of the base layer, and a surface layer having a thickness of 45 μm was formed on an outer peripheral surface of the intermediate layer, was produced in accordance with the manner of Example 24 except that each material as above-mentioned was employed.

EXAMPLE 30

Preparation of Base Layer Material
Silicone rubber with carbon black dispersed therein (KE1350AB available from Shin-Etsu Chemical Co., Ltd. of Tokyo, Japan) was prepared.

Preparation of Intermediate Layer Material
An electrical conductive composition was prepared in the same manner as in Comparative Example 5.

Preparation of Surface Layer Material
An electrical conductive composition was prepared in the same manner as in Example 21.

Production of Developing Roll
A developing roll, wherein a base layer having a thickness of 4 mm was formed on an outer peripheral surface of the shaft, an intermediate layer having a thickness of 5 μm was formed on an outer peripheral surface of the base layer, and a surface layer having a thickness of 45 μm was formed on an outer peripheral surface of the intermediate layer, was produced in accordance with the manner of Example 24 except that each material as above-mentioned was employed.

EXAMPLE 31

Preparation of Base Layer Material
Silicone rubber with carbon black dispersed therein (KE1350AB available from Shin-Etsu Chemical Co., Ltd. of Tokyo, Japan) was prepared.

Preparation of Intermediate Layer Material
An electrical conductive composition was prepared in the same manner as in Example 20.

Preparation of Surface Layer Material
An electrical conductive composition was prepared in the same manner as in Example 23.

Production of Developing Roll
A developing roll, wherein a base layer having a thickness of 4 mm was formed on an outer peripheral surface of the shaft, an intermediate layer having a thickness of 5 μm was formed on an outer peripheral surface of the base layer, and a surface layer having a thickness of 45 μm was formed on an outer peripheral surface of the intermediate layer, was produced in accordance with the manner of Example 24 except that each material as above-mentioned was employed.

COMPARATIVE EXAMPLE 10

Preparation of Surface Layer Material
An electrical conductive composition was prepared in the same manner as in Comparative Example 3.

Production of Developing Roll
A developing roll, wherein a base layer having a thickness of 4 mm was formed on an outer peripheral surface of the shaft, an intermediate layer having a thickness of 5 m was formed on an outer peripheral surface of the base layer, and a surface layer having a thickness of 45 μm was formed on an outer peripheral surface of the intermediate layer, was produced in accordance with the manner of Example 29 except that the aforesaid surface layer material was employed.

The developing rolls of the Examples and the Comparative Examples thus produced were evaluated for their properties in the above-mentioned manner for the charging rolls The results of the evaluation are shown in Table 9.

TABLE 9

|  | Example | | | Comparative Example |
|---|---|---|---|---|
|  | 29 | 30 | 31 | 10 |
| Electrical resistance (Ω) | | | | |
| 10 V | $4.5 \times 10^6$ | $5.4 \times 10^6$ | $8.0 \times 10^7$ | $3.5 \times 10^6$ |
| 100 V | $1.6 \times 10^6$ | $1.1 \times 10^6$ | $6.0 \times 10^7$ | $1.1 \times 10^6$ |

TABLE 9-continued

|  | Example | | | Comparative Example |
|---|---|---|---|---|
|  | 29 | 30 | 31 | 10 |
| Voltage dependency of electrical resistance (digit) | 0.44 | 0.70 | 0.13 | 0.51 |
| Environment dependency of electrical resistance (digit) | 0.5 | 0.4 | 0.4 | 0.5 |
| Hardness (JIS A) | 27 | 27 | 27 | 27 |
| Compression set (%) | 6 | 6 | 6 | 6 |
| Developing roll characteristics |  |  |  |  |
| Image uniformity | ○ | ○ | ○ | ○ |
| Variation of image quality due to environment | ○ | ○ | ○ | ○ |
| Concentration variation due to charge-up | ○ | ○ | ○ | ○ |
| Variation of digits of electrical resistance due to environment (digit) | 0.5 | 0.4 | 0.4 | 3.9 |

As can be understood from the results, the developing rolls of the Examples had smaller electrical resistance variation than that of the Comparative Example According to the present invention, the electrically conductive polymer, the semiconductive composition and the semiconductive member, both using the electrically conductive polymer can be preferably used for the electrophotographic equipments such as a charging roll.

What is claimed is:

1. A semiconductive composition, for electrophotographic equipment comprising: a solvent-soluble electrically conductive polymer obtained by imparting electrical conductivity by means of a dopant to a pi-electron conjugated polymer which is at least one selected from the group consisting of aniline, pyrrole, thiophene and their derivatives, and comprises an alkyl substituent group or an alkoxy substituent group each having 1 to 4 carbons; and a non-conjugated polymer, wherein the dopant comprises an alkylbenzenesulforxic acid or its salt having 2 or more alkyl substituent groups, at least one of the alkyl substituent groups having 4 to 18 carbons and a total carbon number of the alkyl substituent groups being 10 to 37, wherein the non-conjugated polymer has a sulfonic acid or its salt.

2. A semiconductive composition for electrophotographic equipment according to claim 1, wherein the alkylbenzenesulfonic acid or its salt is one or a mixture of two or more selected from the group consisting of the following B1 to B7:

B1: an alkylbenzenesulfonic acid or its salt having a methyl group (—$CH_3$), a butyl group (—$C_4H_9$) and a pentyl group (—$C_5H_{11}$)

B2: an alkylbenzenesulfonic acid or its salt having two pentyl groups (—$C_5H_{11}$) and a hexyl group (—$C_6H_{13}$)

B3: an alkylbenzenesulfonic acid or its salt having a pentyl groups (—$C_5H_{11}$) and two hexyl group (—$C_6H_{13}$)

B4: an alkylbenzenesulfonic acid or its salt having three hexyl groups (—$C_6H_{13}$)

B5: an alkylbenzenesulfonic acid or its salt having two pentyl groups (—$C_5H_{11}$) and a decyl group (—$C_{10}H_{21}$)

B6: an alkylbenzenesulfonic acid or its salt having a decyl group and (—$C_{10}H_{21}$) and a pentadecyl group (—$C_{15}H_{31}$)

B7: an alkylbenzenesulfonic acid or its salt having a methyl group (—$CH_3$) and two octadecyl groups (—$C_{18}H_{37}$).

3. A semiconductive composition for electrophotographic equipment according to claim 1, wherein the non-conjugated polymer is at least one selected from the group consisting of acrylic resins, urethane resins and thermoplastic elastomers, and has a sulfonic acid or its salt.

4. A semiconductive member for electrophotographic equipment, comprises the semiconductive composition according to claim 1.

5. A semiconductive member for electrophotographic equipment according to claim 4, wherein the semiconductive member is a conductive roll or a conductive belt.

6. A semiconductive member for electrophotographic equipment according to claim 5, wherein the conductive roll is a developing roll, a charging roll, a transfer roll or a toner supply roll.

7. A semiconductive member for electrophotographic equipment according to claim 5, wherein the conductive belt is a intermediate transcription belt or a sheet feeding belt.

* * * * *